United States Patent
Van De Graaff et al.

(10) Patent No.: US 7,023,755 B2
(45) Date of Patent: Apr. 4, 2006

(54) LOW POWER CONTROL CIRCUIT AND METHOD FOR A MEMORY DEVICE

(75) Inventors: Scott Van De Graaff, Boise, ID (US); Tim Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 10/725,315

(22) Filed: Dec. 2, 2003

(65) Prior Publication Data

US 2005/0117432 A1   Jun. 2, 2005

(51) Int. Cl.
G11C 5/14 (2006.01)
G11C 11/4074 (2006.01)
G11C 11/4193 (2006.01)

(52) U.S. Cl. .................. 365/226; 365/227; 365/189.05
(58) Field of Classification Search ................ 365/226, 365/227, 189.05, 189.09
See application file for complete search history.

(56) References Cited

U.S. PATENT DOCUMENTS

| | | | | |
|---|---|---|---|---|
| 5,539,692 A | * | 7/1996 | Kajigaya et al. | 365/189.01 |
| 5,793,776 A | * | 8/1998 | Qureshi et al. | 714/724 |
| 6,058,063 A | * | 5/2000 | Jang | 365/227 |
| 6,549,479 B1 | | 4/2003 | Blodgett | |
| 6,603,698 B1 | | 8/2003 | Janzen | |
| 6,816,994 B1 | * | 11/2004 | Schoenfeld et al. | 716/1 |

* cited by examiner

*Primary Examiner*—Richard Elms
*Assistant Examiner*—J. H. Hur
(74) *Attorney, Agent, or Firm*—Dickstein Shapiro Morin & Oshinsky LLP

(57) ABSTRACT

A memory device with a low power control circuit that reduces power while ensuring that the device remains in a low power mode until a high power mode has been requested. The low power control circuit initially monitors a control signal using a CMOS buffer or inverter while a reference voltage is grounded or floated. Upon CMOS detection of a signal indicating that a high power mode is required, the low power control circuit monitors the signal using a differential amplifier and the specified reference voltage (i.e., ungrounded and un-floated reference voltage) to determine if the low power mode should be exited. In doing so, the low power control circuit prevents noise from inadvertently causing the device to exit the low power mode while at the same time reduces the power in the device.

75 Claims, 5 Drawing Sheets

LOW POWER CONTROL CIRCUIT AND METHOD FOR A MEMORY DEVICE

FIELD OF THE INVENTION

The invention relates generally to semiconductor memory devices, and more particularly to an improved method and apparatus for allowing grounded Vref voltages during low power modes of a semiconductor memory device.

BACKGROUND

There is a demand for faster, higher capacity, random access memory (RAM) devices. RAM devices, such as dynamic random access memory (DRAM) devices are typically used as the main memory in computer systems. Although the operating speed of the DRAM has improved over the years, the speed has not reached that of the processors used to access the DRAM.

Synchronous dynamic random access memory (SDRAM) has been developed to provide faster operation in a synchronous manner. SDRAMs are designed to operate synchronously with the system clock. That is, input and output data of the SDRAM are synchronized to an active edge of the system clock which is driving the processor accessing the SDRAM.

Double data rate (DDR) SDRAMs and second generation DDR SDRAMs, known as DDR II SDRAMs, are being developed to provide twice the operating speed of the conventional SDRAM. These devices allow data transfers on both the rising and falling edges of the system clock and thus, provide twice as much data as the conventional SDRAM.

It is desirable that DDR SDRAM devices are operated in accordance with industry standards, such as the Stub Series Terminated Logic for 2.5V (SSTL_2) standard. By adhering to industry standards, the DDR SDRAM devices are assured of being compatible with other industry components that also adhere to the standards. This way, components from different manufacturers may be integrated into the same system without adversely impacting the performance of the system.

Current standards dictate that DDR SDRAM devices have "low" power operations such as e.g., power-down and self-refresh operations. These low power operations are initiated when a clock enable control signal (CKE), which activates and deactivates an internal clock of the DDR SDRAM, is received having a value that disables the internal clock. During a power-down condition, the specification indicates that all input buffers should be disabled with the exception of input buffers used for the clock enable CKE and differential clock input signals CK, CK#. During self-refresh, the specification indicates that all input buffers should be disabled with the exception of input buffers used for the clock enable signal CKE. The enabled input buffers, however, draw current, which is undesirable.

Moreover, DDR SDRAM devices use a specified reference voltage (Vref) in its input receiver and buffers. The reference voltage Vref is usually connected to a first input of a differential amplifier while a second input of the amplifier is connected to command, address or data lines. The reference voltage Vref is used to determine whether the received command, address or data has a value of logic 0 or logic 1. The amplifier, however, draws current. It is desirable to reduce the current being drawn in the low power operating modes.

Furthermore, it is desirable to ground or float the reference voltage Vref in the low power operating mode to reduce the overall power consumption of the system that the DDR SDRAM device is used in during the low power modes. Grounding or floating the reference voltage Vref, however, adversely affects the operation of the DDR SDRAM's differential amplifiers, used in the remaining activated buffers, since a small input signal, noise or other glitch can cause the differential amplifier to output a logic 1 instead of a logic 0. For example, if noise were present on the differential amplifier input connected to receive the clock enable signal CKE, the amplifier will output a logic 1 instead of 0, which takes the SDRAM out of the low power mode because the device thinks that a clock enable signal CKE with a value enabling the internal clock has been received. Moreover, the device is susceptible to being repetitively placed into and taken out of the low power mode if there is noise or some other glitch in the device. These scenarios are undesirable and are contrary to the industry standards.

Another technique uses additional TTL logic, such as a TTL buffer or inverter to detect when the clock enable signal CKE is received during low power modes. The TTL buffer does not rely on a comparison to the reference voltage Vref, but has other problems. For example, the clock enable signal CKE is specified by the industry standard as a differential signal, but the buffer is not a differential buffer. If noise were present on the line carrying the clock enable signal CKE to the TTL buffer, the buffer trip point could be reached causing the buffer to output a logic 1 instead of 0, which takes the SDRAM out of a low power mode. This is undesirable and is contrary to the industry standards.

Accordingly, there is a need and desire for an improved method and apparatus that reduces power when operating a DDR SDRAM in a low power operating mode such as power-down or self-refresh.

SUMMARY

The present invention provides a method and apparatus that reduces power in a memory device when operating the device in a low power operating mode.

The above and other features and advantages are achieved in various embodiments of the invention by providing a memory device with a low power control circuit that reduces power in the device while ensuring that the device remains in a low power mode until a high power mode has been requested. The low power control circuit initially monitors a control signal using a CMOS buffer or inverter while a reference voltage is grounded or floated. Upon CMOS buffer detection of a signal indicating that a high power mode is required, the low power control circuit monitors the signal using a differential amplifier and the specified reference voltage (i.e., ungrounded and un-floated reference voltage) to determine if the low power mode should be exited. In doing so, the low power control circuit prevents noise from inadvertently causing the device to exit the low power mode while at the same time reduces the power in the device.

BRIEF DESCRIPTION OF THE DRAWINGS

The foregoing and other advantages and features of the invention will become more apparent from the detailed description of exemplary embodiments provided below with reference to the accompanying drawings, in which.

DETAILED DESCRIPTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention.

Figure 1:
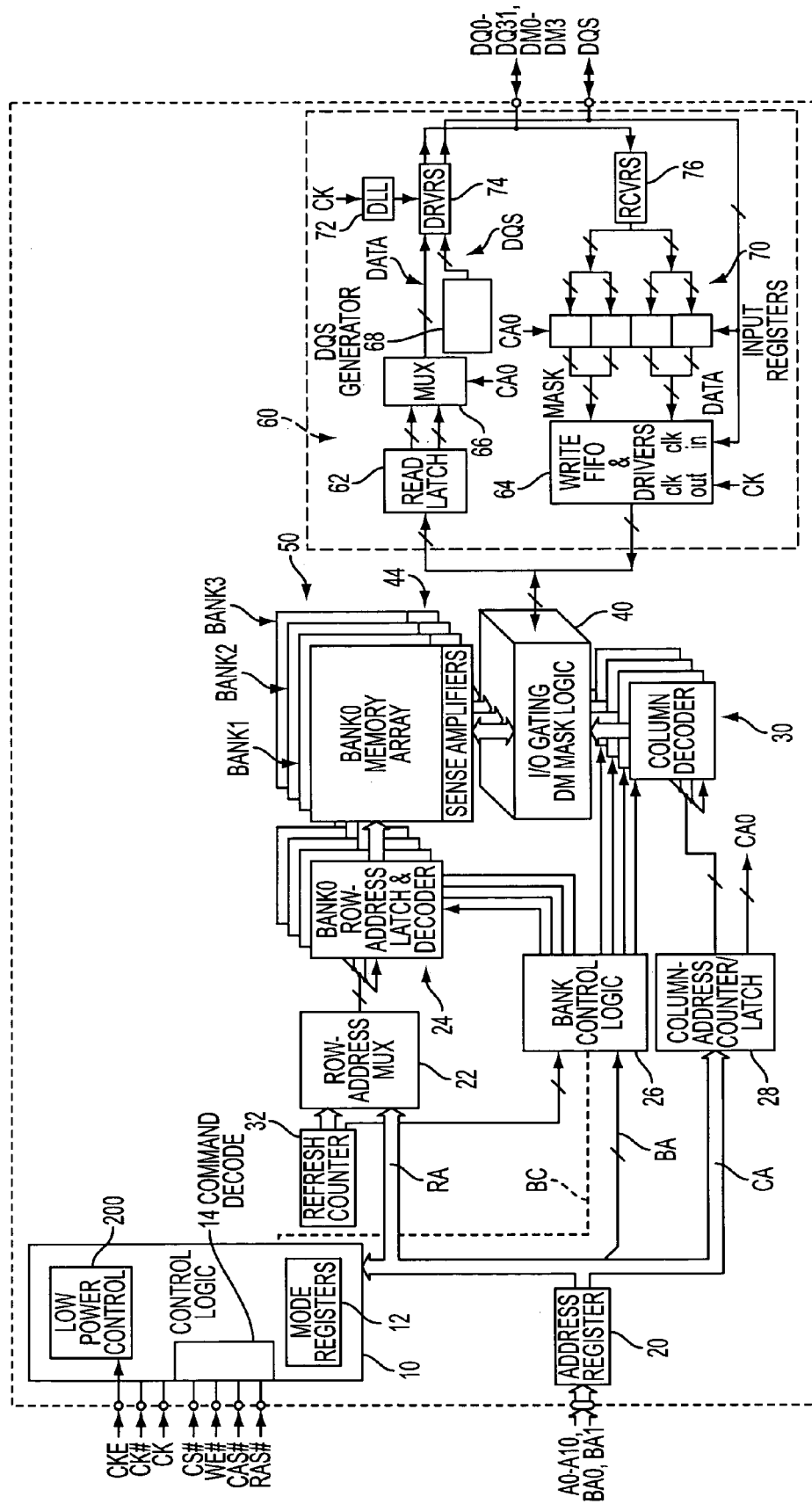
FIG. 1 is a block diagram illustrating a double data rate (DDR) synchronous dynamic random access memory (SDRAM) device constructed in accordance an exemplary embodiment of the invention.

Now referring to the figures, where like reference numbers designate like elements, FIG. 1 shows a DDR SDRAM 100 constructed in accordance with an exemplary embodiment of the invention. The SDRAM 100 includes control logic 10, address registers 20, a row-address multiplexer 22, refresh counter 32, row decoders 24, bank control logic 26, column address counters/latch 28, column decoders 30, I/O (input/output) gating and mask logic 40, sense amplifier circuits 44, memory banks 50, and input/output circuitry 60. In the illustrated embodiment, four memory banks 50, sense amplifier circuits 44, column decoders 30 and row decoders 24 are used in the SDRAM 100. It should be appreciated that the invention can utilize one, two, four, eight or more memory banks 50 and associated amplifiers and decoders.

The address registers 20 input a bank address BA0, BA1 and an address A0–A10. Depending upon the command, the address A0–A10 is either a row address or column address. The address registers 20 output a row address RA, column address CA and bank address BA. The bank address BA is sent to the bank control logic 26, which sends an activation signal to the row and column decoder 24, 30 associated with the bank address BA. The row address RA is sent to the row-address multiplexer 22, which sends the address RA to the activated row decoder 24. As is known in the art, the row decoder 24 will activate the appropriate row of memory in its associated bank 50. The column address CA is sent to the column address counter/latch 28, which sends the address CA to the activated column decoder 30. The latch 28 also outputs the least significant bit CA0 of the column address CA. As is known in the art, the column decoder 30 will activate the addressed column of the appropriate bank of memory 50 (through the I/O gating and mask logic 40 and the sense amplifiers 44). This addressing scheme is used for read and write operations.

The input/output circuitry 60 is connected to the I/O gating and mask logic 40. The input/output circuitry 60 includes a read latch 62, write FIFO and drivers 64, multiplexer 66, DQS generator 68, input registers 70, a delayed lock loop (DLL) 72, drivers 74 and receivers 76. The drivers 74 receive data DATA read from addressed memory location from one of the banks 50 through the logic 40, latch 62 and multiplexer 66. CA0 is used to control the multiplexer 66. The drivers 74 also receive a data strobe DQS strobe from the DQS generators 68. The drivers 74 output the DATA and data strobe DQS to an external device through input/output pins DQ0–DQ31 and the DQS pin.

Data to be written into the SDRAM 100 is input to the receivers 76 through input/output pins DQ0–DQ31 when the data strobe DQS is received. Masking information DM0–DM3 may also be received. The received data or masking information DM0–DM3 is sent to the write FIFO and drivers 64 via the input registers 70 (controlled by CA0) and eventually written into the addressed location in one of the banks 50 (addressing described above).

The control logic 10 includes mode registers 12, a conventional command decoder 14 and a lower power control circuit 200. The registers 12 and command decoder 14 are used to interpret input control signals and drive the remaining circuitry of the SDRAM 100. The low power control circuit 200 is used to reduce power in the SDRAM 100 while ensuring that the SDRAM 100 remains in a low power mode until a high power mode has been requested. The construction and operation of low power control circuit 200 is discussed below in more detail with respect to FIG. 2.

As is known in the art, the control logic 10 inputs the clock enable signal CKE as well as differential clock signals CK, CK#, chip select CS#, write enable WE#, column address strobe CAS# and row address strobe RAS# signals (the # designation indicates that the signal is active low). The CAS#, RAS#, WE#, and CS# signals define the commands received by the control logic 10 while the CK, CK# and CKE signals are used to synchronize the operation of the SDRAM 100 to the external system clock.

Distinct combinations of the control signals constitute distinct commands. For example, the combination of RAS# low, CAS# high and WE# low represents a precharge command. Examples of other well known commands include, but are not limited to, the active, read, write, burst terminate, auto refresh (or self refresh), load mode register, and NOP commands.

As noted earlier, the clock enable signal CKE is used to place the SDRAM 100 into a lower power mode for self-refresh or power down operations. Self refresh is initiated when the auto refresh command is received and the clock enable signal CKE is low. If the clock enable signal CKE is not low, then an auto refresh operation is initiated. Auto refresh, however, is not an operation performed at low power and is not discussed further. Power down, for example, is initiated when the die is idle (i.e., no open banks) and the clock enable signal CKE goes low.

Figure 2:
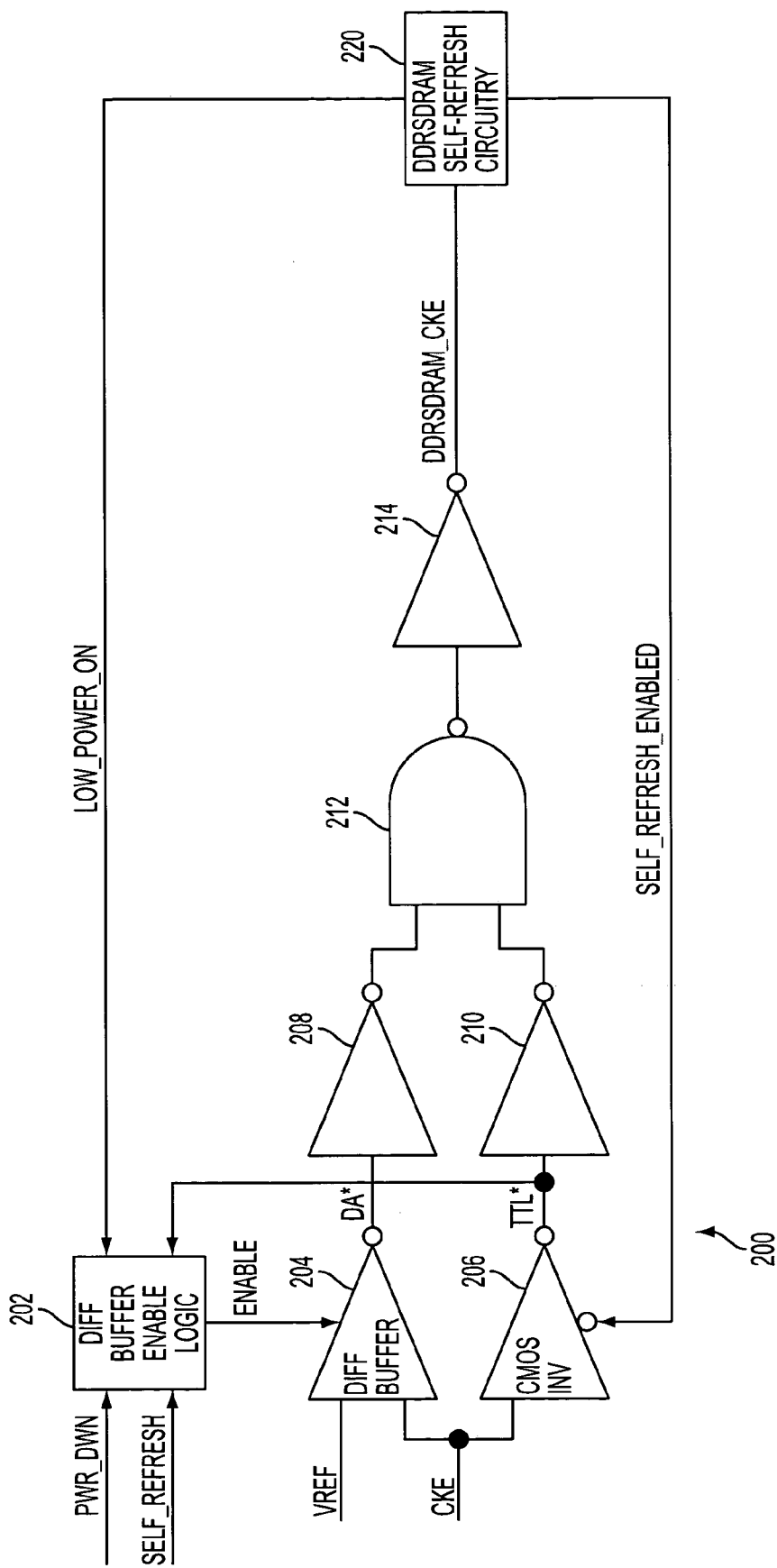
FIG. 2 is a block diagram of a lower power control circuit, used in the FIG. 1 device, constructed in accordance with an exemplary embodiment of the invention.

FIG. 2 is a block diagram of a lower power control circuit 200, used in the SDRAM 100 (FIG. 1), constructed in accordance with an exemplary embodiment of the invention. The circuit 200 includes differential buffer enable logic 202, a differential buffer 204, four OS inverters 206, 208, 210, 214, a NAND gate 212 and self-refresh control circuitry 220.

The differential buffer enable logic 202 inputs a power down signal PWR_DWN and a self-refresh signal SELF_REFRESH. One, or both depending upon the chip specification, of these signals PWR_DWN, SELF_REFRESH are generated by the control logic 10 (FIG. 1) upon the occurrence of the appropriate commands. The differential buffer enable logic 202 also inputs an inverted clock enable signal CKE (TTL*) output from the first inverter 206 and a low power on signal LOW_POWER_ON from the self-refresh control circuitry 220 (discussed below). The differential buffer enable logic 202 outputs an enable signal ENABLE to the differential amplifier 204. One value of the enable signal ENABLE enables the differential amplifier 204, a second value of the enable signal ENABLE disables the differential amplifier 204. In the illustrated embodiment, disabling the differential amplifier 204 causes the amplifier 204 to always have a logic high output.

The differential amplifier 204 is connected to receive the reference voltage Vref and the clock enable signal CKE. When enabled by the enable signal ENABLE, the differential amplifier 204 outputs the inverted value of the differential clock enable signal CKE relative to the reference voltage Vref (e.g., 0 if CKE>Vref, 1 if CKE<Vref). This output signal is referred to as DA*. When disabled by the enable signal ENABLE, the differential amplifier 204 has a logic high output in this configuration. That is, DA* is high. When disabled, the differential amplifier 204 draws no current, which reduces power in the SDRAM. Furthermore, when the differential amplifier 204 is disabled, the reference voltage Vref may be floated or grounded since it is not being used. This reduces the power of the system even further.

When enabled by a self-refresh enabled signal SELF_REFRESH_ENABLED, the first inverter 206 inverts the clock enable signal CKE. This inverted clock enable signal is referred to as TTL* on FIG. 2. In the illustrated embodiment, when disabled by a self-refresh enabled signal SELF_REFRESH_ENABLED, the first inverter 206 always outputs a logic low TTL* signal. The output TTL* of the first inverter 206 is used as an input by the third inverter 210. The output DA* of the differential amplifier 204 is used as an input by the second inverter 208. The outputs of the second and third inverter 208, 210 are used as inputs by the NAND gate 212. The output of the NAND gate 212 is used and inverted by the fourth inverter 214. The output of the fourth inverter 214 is a processed clock enable signal DDRSDRAM_CKE used by the self-refresh control circuitry 220. The processed clock enable signal DDRSDRAM_CKE will have the logic level of a properly generated clock enable signal CKE.

The self-refresh control circuitry 220 outputs the self-refresh enabled signal SELF_REFRESH_ENABLED and the low power on signal LOW_POWER_ON. The self-refresh control circuitry 220 also outputs signals to other circuitry on the DDR SDRAM that indicates that low power mode is being initiated (not shown).

Figure 5:
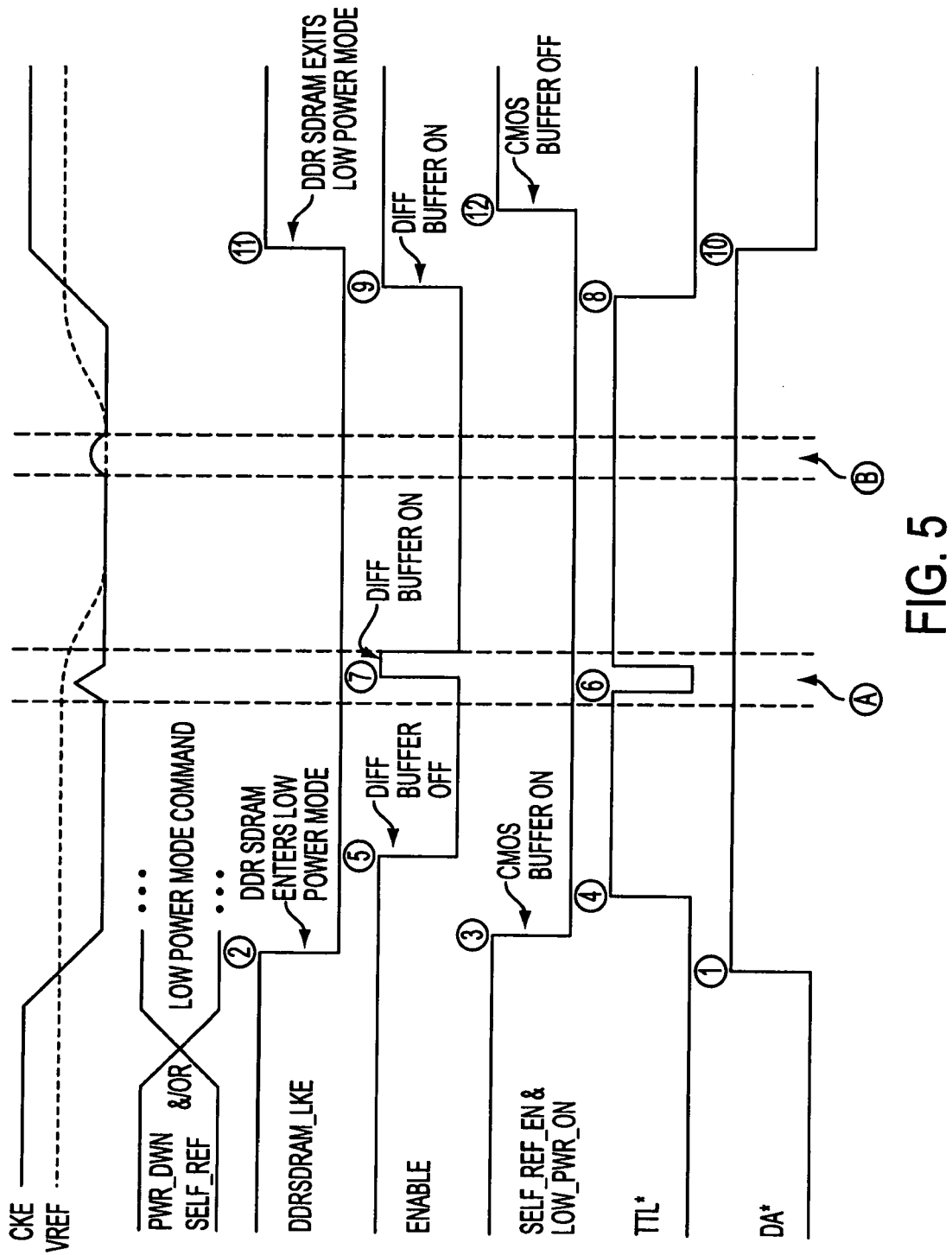
FIG. 5 is an exemplary timing diagram for an exemplary embodiment of the invention.

The operation of the circuit 200 is now described with respect to FIGS. 2 and 5. In a normal mode of operation, the differential amplifier 204 is enabled (i.e., the enable signal ENABLE has a value that enables the amplifier 204), the reference voltage Vref is the specified reference voltage (i.e., not grounded or floated) and the first inverter 206 is disabled (i.e., the self-refresh enabled signal SELF_REFRESH_ENABLED has a value that disables the inverter 206). This means, that the first inverter 206 has a logic low TTL* signal. With this setup, the differential amplifier 204 is used to sense when the SDRAM should be placed into the low power mode (i.e., when the clock enable signal CKE is driven to a low logic level).

When the clock enable signal CKE is driven low by a low power command, the differential amplifier 204 detects the low level, inverts it and passes a high DA* signal (reference numeral 1 on FIG. 5) to the second inverter 208 (as discussed further, the signal is passed to the self-refresh control circuitry 220 and logic 202 which evaluates TTL* to see if it is tripped and disables the differential amplifier 204, if TTL* tripped). The second inverter 208 outputs a low logic level signal to its corresponding input of the NAND gate 212. The other input of the NAND gate 212 receives a high logic level signal, since the low level TTL* signal is inverted by inverter 210 and applied to the NAND gate 212. The NAND gate 212, having one low and one high input, outputs a high signal to the fourth inverter 214. The fourth inverter 214 outputs a low processed clock enable signal DDRSDRAM_CKE to the self-refresh control circuitry 220 (reference numeral 2 on FIG. 5).

The low processed clock enable signal DDRSDRAM_CKE is a signal to the self-refresh control circuitry 220 that self-refresh or power down is enabled (i.e., the clock enable signal CKE has been driven to a low logic level). The self-refresh control circuitry 220 outputs the self-refresh enabled signal SELF_REFRESH_ENABLED having a value that enables the first inverter 206. The self-refresh control circuitry 220 outputs the low power on signal LOW_POWER_ON to the differential buffer enable logic 202, which causes the differential buffer enable logic 202 to look at the state of TTL* (reference numeral 3 on FIG. 5). If TTL* is high (i.e., logic one), then the logic 202 outputs an enable signal ENABLE that disables the differential amplifier 204 (reference numerals 4 and 5 on FIG. 5). It should be noted that the occurrence of the power down PWR_DWN or self-refresh SELF_REFRESH signals could also be used to generate an enable signal ENABLE that disables the differential amplifier 204 if so desired.

In low power mode, the clock enable signal CKE is low, which is eventually passed to the self-refresh circuitry 220 as a low processed clock enable signal DDRSDRAM_CKE. This signal causes the self-refresh control circuitry 220 to output the self-refresh enabled signal SELF_REFRESH_ENABLED having a value that enables the first inverter 206 (in this case keeps the inverter 206 enabled). The self-refresh control circuitry 220 outputs the low power on signal LOW_POWER_ON to the differential buffer enable logic 202 to ensure that the differential amplifier 204 remains disabled, which in the illustrated embodiment causes the differential amplifier 204 to output a high DA* signal to the input of the second inverter 208.

If a high clock enable signal CKE is received at the first inverter 206, indicating an attempt to switch out of the self-refresh or power down operations, the output TTL* of the first inverter 206 will go low (reference numerals 6, 8 on FIG. 5). The low signal is inverted by the third inverter 210 causing a high signal to be applied to its corresponding input of the NAND gate 212. Because the differential amplifier 204 applies a high DA* signal to the second inverter 208, the second inverter 208 outputs a low signal to the other input of the NAND gate 212. The NAND gate 212 continues to output a logic high signal causing the fourth inverter 214 to output a low processed clock enable signal DDRSDRAM_CKE. This keeps the DDRSDRAM circuitry 220 in the low power mode just in case there was noise or other glitches on the line carrying the clock enable signal. As such, the DDRSDRAM circuitry 220 continues to output the LOW_POWER_ON signal with a state indicating that low power is on and the SELF_REFRESH_ENABLED signal with a value that keeps the first inverter 206 enabled. This way, the SDRAM is kept in the low power mode just in case there was noise or other glitches on the line carrying the clock enable signal.

The low output TTL* of the first inverter 206 is also fed to the differential buffer enable logic 202, which causes the differential buffer enable logic 202 to output an enable signal ENABLE that enables the differential amplifier 204 (reference numerals 7, 9 on FIG. 5). At this point, both the differential amplifier 204 and the first inverter 206 are used to determine if the clock enable signal CKE has really been driven to the high logic level, which tells the SDRAM to exit the low power mode.

If a high clock enable signal CKE is no longer being generated, then the transition of the CKE signal was merely a glitch. As such, the TTL* will be high, causing the ENABLE signal to go low, which disables the differential amplifier 204 once again. This glitch is reflected in the timing diagram in the region indicated by arrow A. This region A shows that the low power control circuit 200 has glitch rejection up to the trip point of the differential amplifier 204 when a clock enable signal CKE spikes. The region in the timing diagram indicated by arrow B shows that the low power control circuit 200 has glitch rejection up to the trip point of the CM0S buffer 206 during low power mode (i.e., when Vref is grounded or floated).

If a high clock enable signal CKE is still being generated, it is received at the first inverter 206 and the differential amplifier 204. The first inverter 206 and the differential amplifier 204 output low signals (reference numerals 8, 10 on FIG. 5). The second and third inverters 208, 210 output high logic level signals to their respective inputs of the NAND gate 212. The NAND gate 212 outputs a logic low signal causing the fourth inverter 214 to output a high processed clock enable signal DDRSDRAM_CKE (reference numeral 11 on FIG. 5). As such, the DDRSDRAM circuitry 220 outputs the LOW_POWER_ON signal with a state indicating that low power is off and the SELF_REFRESH_ENABLED signal with a value that disables the first inverter 206 (reference numeral 12 on FIG. 5). This returns the SDRAM device to the normal power operating mode. The DDRSDRAM self-refresh circuitry 220 discontinues its self-refresh/power down operations.

The illustrated embodiment completely chokes off current to the differential amplifier 204 during the low power mode. To get out of the low power mode, the current must be reapplied to the amplifier, which must become operational and detect the clock enable signal CKE as described above within a certain specified period of time. Depending upon the timing requirements imposed by the industry standard, chip specification or application, a speedier response may be required. One exemplary solution, is to reduce the current flowing to the amplifier 204, instead of completely choking off the current, so that the amplifier 204 becomes operational much faster when the full current is reapplied. Thus, a tradeoff of slightly less power reduction versus increased operating speed is proposed.

Figure 3:
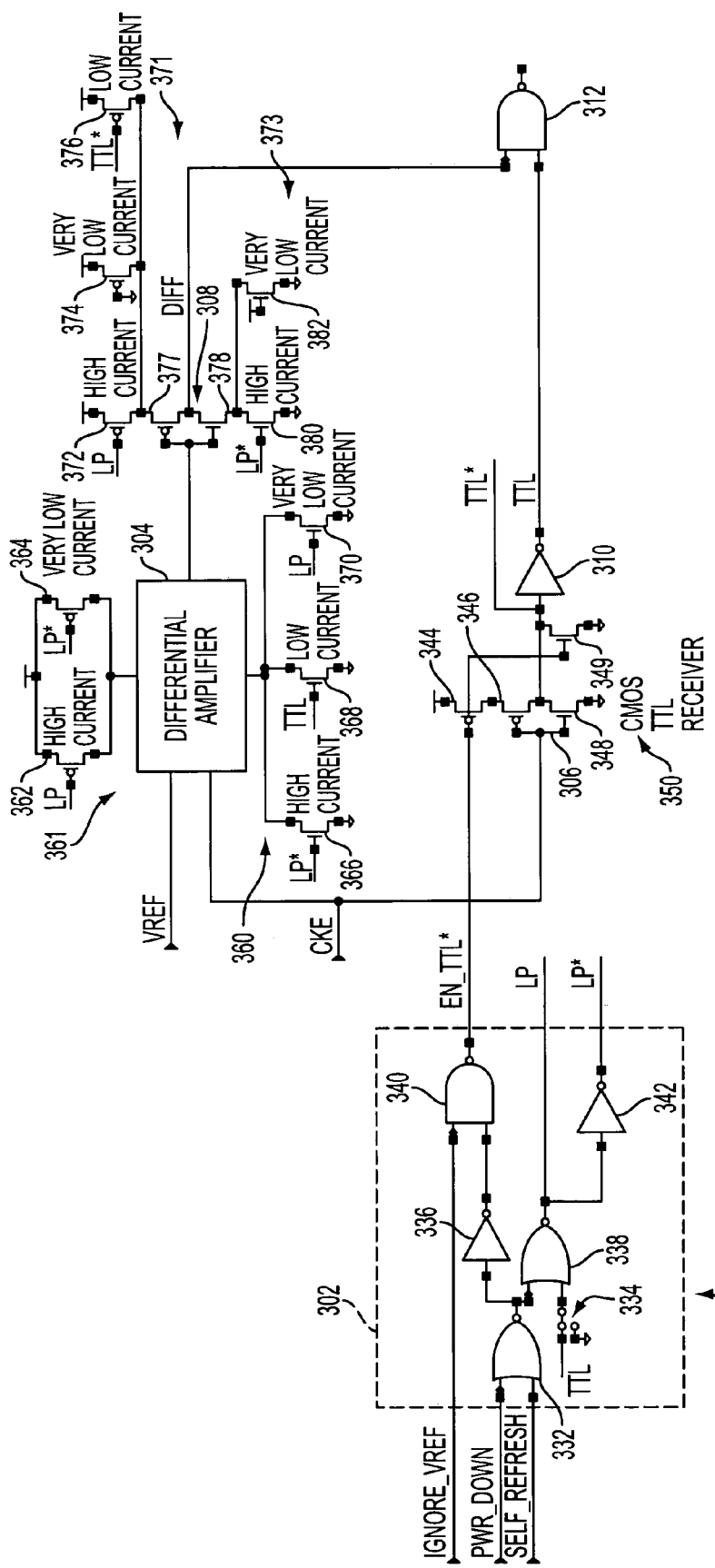
FIG. 3 is a block diagram of a lower power control circuit, used in the FIG. 1 device, constructed in accordance with another exemplary embodiment of the invention.

FIG. 3 illustrates another lower power control circuit 300, used in the SDRAM 100 (FIG. 1), constructed in accordance with another exemplary embodiment of the invention. As is discussed below in more detail, the low power control circuit 300 can partially disable its differential amplifier 304 such that less power is consumed by the SDRAM, yet the amplifier 304 has a response time that is faster than completely choking off the amplifier 204 when enabled.

The low power control circuit 300 includes differential buffer enable logic 302, the differential amplifier 304, three CM0S inverters 306, 308, 310, a NAND gate 312, CM0S TTL receiver circuitry 350, and current producing circuits 360, 361, 371, 373.

The illustrated differential buffer enable logic 302 includes two NOR gates 332, 338, two inverters 336, 342, a NAND gate 340 and a switch 334. The first NOR gate 332 inputs a power down signal PWR_DWN and a self-refresh signal SELF_REFRESH. One, or both depending upon the chip specification, of these signals PWR_DWN, SELF_REFRESH are generated by the control logic 10 (FIG. 1) upon the occurrence of the appropriate commands. The output of the first NOR gate 332 is sent to inverter 336 and the second NOR gate 338. The output of inverter 336 is sent to NAND gate 340.

An ignore Vref signal IGNORE_VREF is also applied as an input to NAND gate 340. In a desired embodiment, the ignore Vref signal IGNORE_VREF is connected to an antifuse, or some other device such as a laser fuse or metal option, that is programmed based on the desired application. The ignore Vref signal IGNORE_VREF will have one of two values and is discussed in more detail below. The second input of the second NOR gate 338 is connected to the TTL output from inverter 310 or a ground potential via the switch 334. That is, when the switch 334 is in a first position, the second NOR gate 338 inputs the TTL signal, but when the switch 334 is in the second position, the second NOR gate 338 inputs a logic low (from the ground potential). In a desired embodiment, the switch 334 (or fuse or metal option) is set during the manufacturing of the SDRAM (e.g., in a metal mask) based on the desired application for the SDRAM.

The values of the ignore Vref signal IGNORE_VREF and the position of the switch 334 will place the illustrated low power control circuit 300 into one of four operating modes as illustrated in Table I and discussed below in more detail below.

TABLE I

| IGNORE_VREF | Switch 334 | Operational Mode |
|---|---|---|
| GND | GND | Inverter 306 always disabled; Vref always a care; and amplifier 304 is "partially choked" (e.g., 25% reduction of current) in low power modes. |
| GND | TTL | Inverter 306 always disabled; Vref always a care; and amplifier 304's current is never reduced or choked off. |
| VCC | GND | Inverter 306 enabled in low power mode; Vref is a don't care while low power mode active; and amplifier 304 enters low power mode as "mostly choked" (e.g., %75% reduction of current). |
| VCC | TTL | Inverter 306 enabled in low power mode; Vref is a don't care while low power mode active; and amplifier 304 enters low power mode "mostly choked" (e.g., %75% reduction of current) only if CKE is low enough to trip inverter 306. |

The output of NAND gate 340 is an enable TTL inverter signal EN_TTL*, which is applied to the CM0S TTL receiver circuitry 350. The output of the second NOR gate 338 is a low power LP signal, which is applied to the current producing circuits 360, 361, 371, 373. The low power signal LP is also applied to and inverted by inverter 342 to produce an inverted low power signal LP*, which is applied to the current producing circuits 360, 361, 371, 373.

The CM0S TTL receiver circuitry 350 includes two p-channel MOSFETs 344, 346 and two n-channel MOSFETs 348, 349. The first p-channel MOSFET 344 is connected between a supply voltage and the second p-channel MOSFET 346. The first p-channel MOSFET 344 has its gate coupled to the enable TTL inverter signal EN_TTL*. The second p-channel MOSFET 346 is connected to the first n-channel MOSFET 348 such that they form inverter 306.

The inverter 306 receives the clock enable signal CKE and inverts it to form the inverted clock enable signal TTL*. The enable TTL inverter signal EN_TTL* is also connected to the gate of the second n-channel transistor 349. The second n-channel transistor 349 is connected between the input of inverter 310 and ground. A logic high enable TTL inverter signal EN_TTL* causes the second n-channel transistor 349 to pull the input of inverter 310 to ground, causing the inverter 310 to output a high TTL signal. A logic low enable TTL inverter signal EN_TTL* causes the second n-channel transistor 349 to turn (or remain) off, allowing the inverted clock enable signal TTL* to be applied to the inverter 310 and the TTL signal to be applied to NAND gate 312.

One difference between the differential amplifier 304 of the illustrated embodiment and the amplifier 204 of the FIG. 2 embodiment is that the amplifier 304 of the illustrated embodiment is partially or mostly choked, if at all, rather than completely choked (as is done in the FIG. 2 embodiment). To do so, current producing circuits 360, 361, 371, 373 are used to supply high current, low current or very low current to the amplifier 304 and inverter 308.

The first current producing circuit 360 includes three n-channel MOSFETs 366, 368, 370. The first n-channel MOSFET 366 has its gate connected to the inverted low power signal LP*. When the inverted low power signal LP* has a value (i.e., high) that turns on the first n-channel MOSFET 366, a high current is applied to the differential amplifier 304. The second n-channel MOSFET 368 has its gate connected to the TTL signal from inverter 310. When the TTL signal has a value (i.e., high) that turns on the second n-channel MOSFET 368, a low current is applied to the differential amplifier 304. The third n-channel MOSFET 370 has its gate connected to the low power signal LP. When the low power signal LP has a value that turns on the third n-channel MOSFET 370, a very low current is applied to the differential amplifier 304.

The second current producing circuit 361 includes two p-channel MOSFETs 362, 364. The first p-channel MOSFET 362 has its gate connected to the low power signal LP. When the low power signal LP has a value (i.e., low) that turns on the first p-channel MOSFET 362, a high current is applied to the differential amplifier 304. The second p-channel MOSFET 364 has its gate connected to the inverted low power signal LP*. When the inverted low power signal LP* has a value (i.e., low) that turns on the second p-channel MOSFET 364, a very low current is applied to the differential amplifier 304.

It is the application of the currents from the current producing circuits 360, 361 that cause the amplifier to be: (1) fully enabled (i.e., high current); (2) disabled, yet powered by a low current (e.g., approximate %25 reduction of current); or (3) disabled, yet powered by a very low current (e.g., approximate %75 reduction of current).

The differential amplifier 304 inputs the clock enable signal CKE and the reference voltage Vref. The output of the differential amplifier 304 is fed to inverter 308. The output of inverter 308 is the differential clock enable signal DIFF. The output of the NAND gate 312 is a processed clock enable signal that is used by self-refresh control circuitry (such as the self-refresh control circuitry 220 of FIG. 2).

Inverter 308, comprised of two transistors 377, 378, is powered by the third and fourth current producing circuits 371, 373. The third current producing circuit 371 includes three p-channel MOSFETs 372, 374, 376. The first p-channel MOSFET 372 has its gate connected to the low power signal LP. When the low power signal LP has a value (i.e., low) that turns on the first p-channel MOSFET 372, a high current is applied to inverter 308. The second p-channel MOSFET 374 has its gate connected to ground and thus, a very low current is applied to the inverter 308 at all times. The third p-channel MOSFET 376 has its gate connected to the inverted TTL signal TTL* from inverter 306. When the inverted TTL signal TTL* has a value (i.e., low) that turns on the third p-channel MOSFET 376, a low current is applied to inverter 308.

The fourth current producing circuit 373 includes two n-channel MOSFETs 380, 382. The first n-channel MOSFET 380 has its gate connected to the inverted low power signal LP*. When the inverted low power signal LP* has a value (i.e., high) that turns on n-channel MOSFET 380, a high current is applied to inverter 308. The second n-channel MOSFET 382 has its gate connected to the supply voltage and thus, a very low current is applied to inverter 308 at all times.

As set forth above in Table I, the operation of the illustrated low power control circuit 300 depends on the programming of the ignore Vref signal IGNORE_VREF and the position of the switch 334 in the differential enable logic 302. In one mode, low power mode is never entered (i.e., IGNORE_VREF is grounded and the switch 334 is connected to the TTL signal). In the other modes, low power mode is entered and the differential amplifier is either "partially choked" (i.e., approximately %25 reduction in applied current) or "mostly choked" (i.e., approximately %75 reduction in applied current). In the low power modes, the low power control circuit 300 operates essentially the same as the low power control circuit 200 illustrated in FIG. 2, with the exception of how the differential amplifier is disabled (i.e., partially or mostly choked in circuit 300 as opposed to completely choked in circuit 200). Otherwise, the logic is the same for entering the low power mode using the differential amplifier 304, using inverter 306 to detect an attempt to exit low power mode, using both inverter 306 and differential amplifier 304 to ensure that the clock enable signal CKE is driven to the value to exit low power mode, and exiting the low power mode (and disabling the inverter 306) in a specified amount of time.

Figure 4:
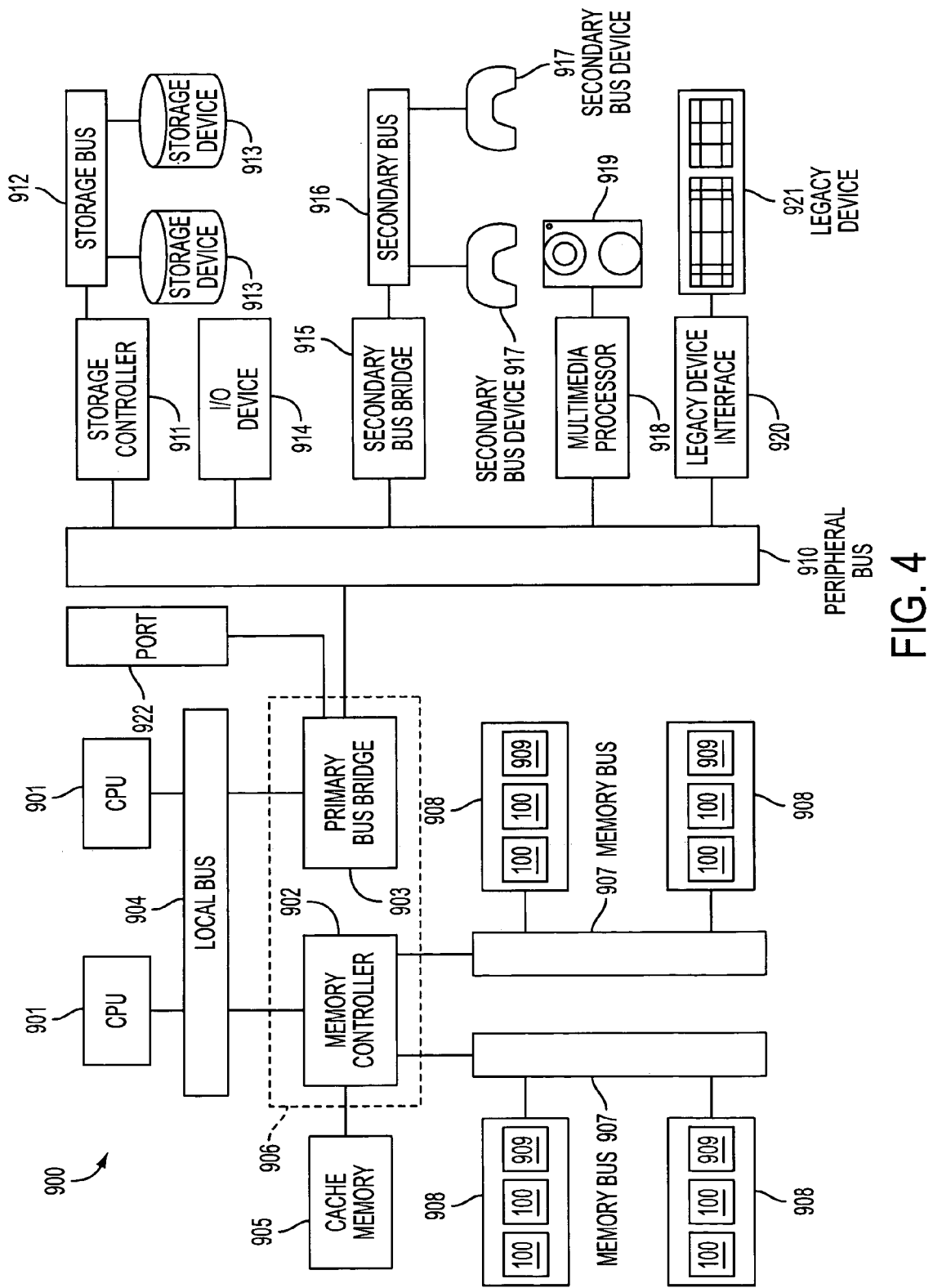
FIG. 4 shows a processor system incorporating at least one DDR SDRAM constructed in accordance with an embodiment of the invention.

FIG. 4 illustrates an exemplary processing system 900 which may utilize a memory device 100 constructed in accordance with an embodiment of the present invention. That is, the memory device 100 is a DDR SDRAM or DDR SDRAM II device having a low power control circuit 200, 300 as illustrated in FIGS. 1–3.

The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge 916 may be used to interface additional devices via another bus to the processing system 900. For example, the secondary bus bridge 21 may be a universal serial port (USB) controller used to couple USB devices 917 to the processing system 900. The multimedia processor 918 may be a sound card, a video capture card, or any other type of media interface, which may also be coupled to additional devices such as speakers 919. The legacy device interface 920 is used to couple legacy devices 221. for example, older styled keyboards and mice, to the processing system 900.

The processing system 900 illustrated in FIG. 4 is only an exemplary processing system with which the invention may be used. While FIG. 4 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. A low power control circuit for transitioning a memory device between a first operating mode and a low power operating mode, said low power control circuit comprising:
   a differential circuit connected to a reference voltage and a first control signal; and
   a buffer circuit having an input connected to the first control signal;
   wherein in the first operating mode said differential circuit is used to detect a first value of the first control signal and causes a transition from the first operating mode to the low power operating mode, and in the low power operating mode said buffer circuit and said differential circuit are used to detect a second value of the first control signal and cause a transition from the low power operating mode to the first operating mode, and wherein a level of the reference voltage is altered during the low power operating mode.

2. The low power control circuit of claim 1, wherein the reference voltage is grounded during the low power operating mode.

3. The low power control circuit of claim 1, wherein the reference voltage is floated during the low power operating mode.

4. The low power control circuit of claim 1, wherein said differential circuit comprises a differential amplifier.

5. The low power control circuit of claim 1, wherein said buffer circuit comprises an inverter.

6. The low power control circuit of claim 1, further comprising a first logic circuit connected to the differential circuit and the buffer circuit, said first logic circuit disabling the buffer circuit and enabling the differential circuit in the first operating mode, and in the low power mode, enabling the buffer circuit and disabling the differential circuit until the buffer circuit detects the second value.

7. The low power control circuit of claim 6, further comprising a second logic circuit coupled to the outputs of the buffer circuit and the differential circuit, said second logic circuit combining the outputs of the buffer circuit and the differential circuit to form an output causing the memory device to transition between the first and low power operating modes.

8. The low power control circuit of claim 6, wherein no current is applied to said differential circuit when disabled.

9. The low power control circuit of claim 6, wherein a reduced current is applied to said differential circuit when disabled.

10. The low power control circuit of claim 9, wherein a current reduced by about twenty-five percent of full current is applied to said differential circuit when disabled.

11. The low power control circuit of claim 9, wherein a current reduced by about seventy-five percent of full current is applied to said differential circuit when disabled.

12. The low power control circuit of claim 6, wherein said first logic circuit is connected to receive at least a second control signal indicative of a low power operation.

13. The low power control circuit of claim 12, wherein said low power operation is a self refresh operation.

14. The low power control circuit of claim 12, wherein said low power operation is a power down operation.

15. The low power control circuit of claim 1, wherein said first control signal is a clock enable signal.

16. The low power control circuit of claim 1, wherein said low power control circuit is configured to perform low power control via an antifuse.

17. The low power control circuit of claim 1, wherein said low power control circuit is configured to perform low power control via a metal mask.

18. The low power control circuit of claim 1, wherein said low power control circuit is configured to ignore the reference voltage via an antifuse.

19. A low power control circuit for transitioning a memory device from a first operating mode to a low power operating mode when a first control signal has a first value, and transitioning the memory device from the low power operating mode to the first operating mode when the first control signal has a second value, said low power control circuit comprising:
   a differential amplifier connected to a reference voltage and a first control signal;
   a buffer circuit having an input connected to the first control signal; and
   a first logic circuit connected to said differential amplifier and said buffer circuit, wherein in the first operating mode said first logic circuit disables the buffer circuit and enables the differential amplifier such that the differential amplifier is used to detect the first value, and in the low power mode, enables the buffer circuit and disables the differential amplifier until the buffer circuit detects the second value,
   wherein said memory device is transitioned to said first operating mode only after both said buffer circuit and said differential amplifier detect the second value, and wherein said low power control circuit is adapted to ignore the reference voltage during the low power operating mode.

20. The low power control circuit of claim 19, wherein the reference voltage is grounded during the low power operating mode.

21. The low power control circuit of claim 19, wherein the reference voltage is floated during the low power operating mode.

22. The low power control circuit of claim 19, further comprising a second logic circuit coupled to the outputs of the buffer circuit and the differential amplifier, said second logic circuit combining the outputs of the buffer circuit and the differential amplifier to form an output causing the memory device to transition between the first and low power operating modes.

23. The low power control circuit of claim 19, wherein said differential amplifier is completely choked when disabled.

24. The low power control circuit of claim 19, wherein said differential amplifier is partially choked when disabled.

25. The low power control circuit of claim 19, wherein said differential amplifier is mostly choked when disabled.

26. The low power control circuit of claim 19, wherein said first control signal is a clock enable signal.

27. A memory device comprising:
   a low power control circuit for transitioning said memory device between a first operating mode and a low power operating mode, said low power control circuit comprising:
   a differential circuit connected to a reference voltage and a first control signal; and
   a buffer circuit having an input connected to the first control signal;
   wherein in the first operating mode said differential circuit is used to detect a first value of the first control signal and causes a transition from the first operating mode to the low power operating mode, and in the low power operating mode said buffer circuit and said differential circuit are used to detect a second value of the first control signal and cause a transition from the low power operating mode to the first operating mode, and wherein a level of the reference voltage is altered during the low power operating mode.

28. The memory device of claim 27, wherein the reference voltage is grounded during the low power operating mode.

29. The memory device of claim 27, wherein the reference voltage is floated during the low power operating mode.

30. The memory device of claim 27, wherein said low power control circuit further comprises a first logic circuit connected to the differential circuit and the buffer circuit, said first logic circuit disabling the buffer circuit and enabling the differential circuit in the first operating mode, and in the low power mode, enabling the buffer circuit and disabling the differential circuit until the buffer circuit detects the second value.

31. The memory device of claim 30, wherein said low power control circuit further comprises a second logic circuit coupled to the outputs of the buffer circuit and the differential circuit, said second logic circuit combining the outputs of the buffer circuit and the differential circuit to form an output causing the memory device to transition between the first and low power operating modes.

32. The memory device of claim 30, wherein no current is applied to said differential circuit when disabled.

33. The memory device of claim 30, wherein a reduced current is applied to said differential circuit when disabled.

34. The memory device of claim 30, wherein a current reduced by about twenty-five percent of full current is applied to said differential circuit when disabled.

35. The memory device of claim 30, wherein a current reduced by about seventy-five percent of full current is applied to said differential circuit when disabled.

36. The memory device of claim 30, wherein said first logic circuit is connected to receive at least a second control signal indicative of a low power operation.

37. The memory device of claim 27, wherein said low power operation is a self refresh operation.

38. The memory device of claim 27, wherein said low power operation is a power down operation.

39. The memory device of claim 27, wherein said first control signal is a clock enable signal.

40. A memory device comprising:
   a low power control circuit for transitioning said memory device from a first operating mode to a low power operating mode when a first control signal has a first value, and transitioning the memory device from the low power operating mode to the first operating mode when the first control signal has a second value, said low power control circuit comprising:
   a differential amplifier connected to a reference voltage and a first control signal;
   a buffer circuit having an input connected to the first control signal; and
   a first logic circuit connected to said differential amplifier and said buffer circuit, wherein in the first operating mode said first logic circuit disables the buffer circuit and enables the differential amplifier such that the differential amplifier is used to detect the first value, and in the low power mode, enables the buffer circuit and disables the differential amplifier until the buffer circuit detects the second value, wherein said memory device is transitioned to said first operating mode only after both said buffer circuit and said differential amplifier detect the second value, and wherein said low power control circuit is adapted to ignore the reference voltage during the low power operating mode.

41. The memory device of claim 40, wherein the reference voltage is grounded during the low power operating mode.

42. The memory device of claim 40, wherein the reference voltage is floated during the low power operating mode.

43. The memory device of claim 40, wherein said low power control circuit further comprises a second logic circuit coupled to the outputs of the buffer circuit and the differential amplifier, said second logic circuit combining the outputs of the buffer circuit and the differential amplifier to form an output causing the memory device to transition between the first and low power operating modes.

44. The memory device of claim 40, wherein said differential amplifier is completely choked when disabled.

45. The memory device of claim 40, wherein said differential amplifier is partially choked when disabled.

46. The memory device of claim 40, wherein said differential amplifier is mostly choked when disabled.

47. The memory device of claim 40, wherein said first control signal is a clock enable signal.

48. A processor system comprising:
a processor; and
a memory device comprising a low power control circuit for transitioning said memory device between a first operating mode and a low power operating mode, said low power control circuit comprising:
a differential circuit connected to a reference voltage and a first control signal, and
a buffer circuit having an input connected to the first control signal,
wherein in the first operating mode said differential circuit is used to detect a first value of the first control signal and causes a transition from the first operating mode to the low power operating mode, and in the low power operating mode said buffer circuit and said differential circuit are used to detect a second value of the first control signal and cause a transition from the low power operating mode to the first operating mode,
wherein the reference voltage is floated during the low power operating mode.

49. A processor system comprising:
a processor; and
a memory device comprising a low power control circuit for transitioning said memory device between a first operating mode and a low power operating mode, said low power control circuit comprising:
a differential circuit connected to a reference voltage and a first control signal, and
a buffer circuit having an input connected to the first control signal,
wherein in the first operating mode said differential circuit is used to detect a first value of the first control signal and causes a transition from the first operating mode to the low power operating mode, and in the low power operating mode said buffer circuit and said differential circuit are used to detect a second value of the first control signal and cause a transition from the low power operating mode to the first operating mode, wherein the reference voltage is grounded during the low power operating mode.

50. The system of claim 49, wherein said low power control circuit further comprises a first logic circuit connected to the differential circuit and the buffer circuit, said first logic circuit disabling the buffer circuit and enabling the differential circuit in the first operating mode, and in the low power mode, enabling the buffer circuit and disabling the differential circuit until the buffer circuit detects the second value.

51. The system of claim 49, wherein no current is applied to said differential circuit when disabled.

52. The system of claim 49, wherein a reduced current is applied to said differential circuit when disabled.

53. The system of claim 49, wherein said first logic circuit is connected to receive at least a second control signal indicative of a low power operation.

54. A processor system comprising:
a processor; and
a memory device comprising a low power control circuit for transitioning said memory device between a first operating mode and a low power operating mode, said low power control circuit comprising:
a differential circuit connected to a reference voltage and a first control signal, and
a buffer circuit having an input connected to the first control signal,
wherein in the first operating mode said differential circuit is used to detect a first value of the first control signal and causes a transition from the first operating mode to the low power operating mode, and in the low power operating mode said buffer circuit and said differential circuit are used to detect a second value of the first control signal and cause a transition from the low power operating mode to the first operating mode,
wherein a current reduced by about twenty-five percent of full current is applied to said differential circuit when disabled.

55. A processor system comprising:
a processor; and
a memory device comprising a low power control circuit for transitioning said memory device between a first operating mode and a low power operating mode, said low power control circuit comprising:
a differential circuit connected to a reference voltage and a first control signal, and
a buffer circuit having an input connected to the first control signal,
wherein in the first operating mode said differential circuit is used to detect a first value of the first control signal and causes a transition from the first operating mode to the low power operating mode, and in the low power operating mode said buffer circuit and said differential circuit are used to detect a second value of the first control signal and cause a transition from the low power operating mode to the first operating mode,
wherein a current reduced by about seventy-five percent of full current is applied to said differential circuit when disabled.

56. A processor system comprising:
a processor; and
a memory device including a low power control circuit for transitioning said memory device from a first operating mode to a low power operating mode when a first control signal has a first value, and transitioning the memory device from the low power operating mode to the first operating mode when the first control signal has a second value, said low power control circuit comprising:
a differential amplifier connected to a reference voltage and a first control signal, a buffer circuit having an input connected to the first control signal, and a first logic circuit connected to said differential amplifier and said buffer circuit, wherein in the first operating mode said first logic circuit disables the buffer circuit and enables the differential amplifier such that the differential amplifier is used to detect the first value, and in the low power mode, enables the buffer circuit and disables the differential amplifier until the buffer circuit detects the second value, wherein said memory device is transitioned to said first operating mode only after both said buffer circuit and said differential amplifier detect the second value, and wherein said low power control circuit is adapted to ignore the reference voltage during the low power operating mode.

57. The system of claim 56, wherein the reference voltage is grounded during the low power operating mode.

58. The system of claim 56, wherein the reference voltage is floated during the low power operating mode.

59. The system of claim 56, wherein said low power control circuit further comprises a second logic circuit coupled to the outputs of the buffer circuit and the differential amplifier, said second logic circuit combining the outputs of the buffer circuit and the differential amplifier to form an output causing the memory device to transition between the first and low power operating modes.

60. The system of claim 56, wherein said differential amplifier is completely choked when disabled.

61. The system of claim 56, wherein said differential amplifier is partially choked when disabled.

62. The system of claim 56, wherein said differential amplifier is mostly choked when disabled.

63. The system of claim 56, wherein said first control signal is a clock enable signal.

64. A method of transitioning a memory device between a first operating mode and a low power operating mode, said method comprising:

detecting, using a differential circuit, when a first control signal has a first value;

transitioning the memory device from the first operating mode to the low power operating mode;

disabling the differential circuit;

changing a level of a reference voltage used by the differential circuit;

enabling a buffer circuit;

detecting, at the buffer circuit, when the first control signal has a second value;

restoring the level of the reference voltage;

enabling the differential circuit;

detecting, at the buffer circuit and the differential circuit, when the first control signal has the second value; and transitioning the memory device from the low power operating mode to the first operating mode.

65. The method of claim 64, wherein said step of disabling the differential circuit comprises completely choking the differential circuit.

66. The method of claim 64, wherein said step of disabling the differential circuit comprises partially choking the differential circuit.

67. The method of claim 64, wherein said step of disabling the differential circuit comprises mostly choking the differential circuit.

68. The method of claim 64 further comprising the step of grounding a reference voltage connected to the differential circuit during the low power operating mode.

69. The method of claim 64 further comprising the step of floating a reference voltage connected to the differential circuit during the low power operating mode.

70. A method of transitioning a memory device between a first operating mode and a low power operating mode, said method comprising:

comparing a first control signal to a reference voltage;

determining whether the first control signal has a first value based on the comparison;

transitioning the memory device from the first operating mode to the low power operating mode if the first control signal has the first value;

determining when the first control signal has a second value;

ensuring that the first control signal has the second value; and transitioning the memory device from the low power operating mode to the first operating mode if it is ensured that the first control signal has the second value, wherein a level of the reference voltage is altered during the low power operating mode.

71. The method of claim 70 further comprising the step of grounding the reference voltage during the low power operating mode.

72. The method of claim 70 further comprising the step of floating the reference voltage during the low power operating mode.

73. The method of claim 70, wherein said ensuring step comprises comparing the first control signal to the reference voltage once it is determined that the first control signal has the first value.

74. The method of claim 70 further comprising the step of programming an antifuse.

75. The method of claim 70 further comprising the step of setting a switch in a metal mask.

* * * * *

UNITED STATES PATENT AND TRADEMARK OFFICE
CERTIFICATE OF CORRECTION

PATENT NO.        : 7,023,755 B2
APPLICATION NO. : 10/725315
DATED             : April 4, 2006
INVENTOR(S)       : Scott Van De Graaff et al.

It is certified that error appears in the above-identified patent and that said Letters Patent is hereby corrected as shown below:

Column 4, line 55, "OS" should reads --CMOS--;

Column 10, line 50, "coupled the" should read --coupled to the--;

Column 11, line 18, "also coupled" should read --also be coupled--;

Column 11, line 28, "an local" should read --a local--;

Column 11, line 32, "21" should read --916--;

Column 11, line 38, "221" should read --921--; and

Column 11, line 54 "system" should read --systems--.

Signed and Sealed this

Tenth Day of October, 2006

JON W. DUDAS
*Director of the United States Patent and Trademark Office*